United States Patent
Beliveau et al.

(10) Patent No.: US 6,351,391 B1
(45) Date of Patent: Feb. 26, 2002

(54) SIGNAL BUSSES ON PRINTED BOARD STRUCTURES MOUNTING ASIC CHIPS WITH SIGNAL TERMINATION RESISTOR DEVICES USING PLANAR SIGNAL TERMINATING DEVICES

(75) Inventors: Clint A. Beliveau, Beaverton; Wallace D. Doeling, Hillsboro, both of OR (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/571,956

(22) Filed: May 15, 2000

(51) Int. Cl.$^7$ .............................. H05K 7/10; H05K 7/12
(52) U.S. Cl. ....................... 361/767; 361/795; 361/764; 174/255; 257/723; 257/703
(58) Field of Search .................................. 361/767, 748, 361/751, 777, 807, 820, 764, 762, 760, 765, 738, 780, 792–795; 174/255, 257, 258, 259, 263; 257/701, 686, 780, 779, 778, 772, 723, 724, 700, 702, 703; 333/296, 297, 180

(56) References Cited

U.S. PATENT DOCUMENTS

| 4,349,862 A | 9/1982 | Bajorek et al. ............. 361/401 |
| 4,775,573 A | 10/1988 | Turek et al. ................. 428/209 |

(List continued on next page.)

FOREIGN PATENT DOCUMENTS

EP          0 848 585 A1   11/1997

OTHER PUBLICATIONS

IBM Technical Disclosure Bulletin, vol. 20, No. 9, Feb., 1978, "Internal Capacitors and Resistors for Multilayer Ceramic Modules", pp 3436–3437, Lussow.

IBM Technical Disclosure Bulletin, vol. 25, No. 2, Jul., 1982, "Integrated, Low Inductance, Small Area Capacitors for VLSI Semiconductor Packages", pp 883–888 Bajorek et al.

*Primary Examiner*—Jeffrey Gaffin
*Assistant Examiner*—Hung Bui
(74) *Attorney, Agent, or Firm*—Driggs Lucas Brubaker & Hoog Co., LPA (57) ABSTRACT

A printed circuit board structure is provided where there is a circuitized dielectric substrate having a plurality of signal traces thereon. The circuitized substrate has first and second opposite faces. An ASIC chip assembly is mounted on the first face and connected to the surface by solder connections. Preferably, the ASIC chip assembly is mounted on the substrate as an IC chip mounted on a chip carrier with the chip carrier being mounted to the circuit board by solder connections, preferably in the form of a ball grid array.

In one embodiment, a discrete signal termination device is provided which is disposed on the second face of the circuitized substrate directly opposite the ASIC chip assembly. In another embodiment, a discrete signal termination device is disposed between the ASIC chip assembly and the printed circuit board.

The signal termination device includes a plurality of planar resistors embedded in a dielectric material with the resistors being electrically connected to the signal lines on the circuitized substrate, preferably by solder connections, again in the form of a ball grid array.

In yet another embodiment, the signal termination device is formed as a part of the ASIC chip assembly by being incorporated in the chip carrier In all cases, the signal termination device need not be formed as a part of the circuit board but can be formed in discrete individual segments for attachment to either the circuit board or formed as part of the chip carrier, thus utilizing the entire structure of the termination device to form resistors.

19 Claims, 6 Drawing Sheets

U.S. PATENT DOCUMENTS

| | | | |
|---|---|---|---|
| 4,860,166 A | | 8/1989 | Nicholls ..................... 361/414 |
| 5,258,648 A | * | 11/1993 | Lin ............................ 257/747 |
| 5,347,258 A | | 9/1994 | Howard et al. ............. 338/333 |
| 5,473,512 A | * | 12/1995 | Degane et al. .............. 361/760 |
| 5,603,847 A | | 2/1997 | Howard et al. ............... 216/17 |
| 5,635,761 A | * | 6/1997 | Cao et al. ................... 257/700 |
| 5,640,048 A | * | 6/1997 | Selna .......................... 257/738 |
| 5,708,569 A | | 1/1998 | Howard et al. ............. 361/760 |
| 5,847,936 A | * | 12/1998 | Forehand et al. ........... 361/794 |
| 6,037,044 A | * | 3/2000 | Giri et al. ................... 428/209 |
| 6,218,729 B1 | * | 4/2001 | Zavrel, Jr. et al. .......... 257/698 |

* cited by examiner

SIGNAL BUSSES ON PRINTED BOARD STRUCTURES MOUNTING ASIC CHIPS WITH SIGNAL TERMINATION RESISTOR DEVICES USING PLANAR SIGNAL TERMINATING DEVICES

BACKGROUND INFORMATION

1. Field of the Invention

This invention relates generally to the termination of signal busses in printed circuit board structures mounting ASIC chip assemblies and, more particularly, to terminating signal busses in printed circuit board structures on which ASIC chip assemblies are mounted, using individual planar signal terminating devices configured for each ASIC chip assembly.

2. Background Information

In high speed digital designs utilizing an ASIC chip assembly in a printed circuit board, it is often necessary to terminate logic signal buses with resistors to maintain signal integrity. As bus widths and ASIC I/O density increases, the quantity of resistors needed to terminate logic busses increases significantly. Because of the limited amounts of area available on printed circuit boards, it is often not possible to place the required number of discrete resistors needed for bus termination around an ASIC chip assembly that is mounted to the printed circuit board. This becomes quite significant when it is necessary for the resistors which terminate the high speed digital signals to be physically as close to the ASIC chip assembly driver pin as possible.

One prior attempt to resolve this problem is with use of what is known as embedded planar resistor technology, or buried resistors, or BR. With this solution, core laminates with a layer of embedded planar resistive material are used to fabricate the printed circuit board. The resistors are formed through a subtractive etch process in these planar resistive layers. The buried resistors are located in the printed circuit board on the opposite face from and directly beneath the ASIC chip assemblies which are mounted on a face of the printed circuit board. This solves the problem of having terminating resistors as physically close or adjacent the ASIC chip assembly pin driver as possible. However, this planar resistor technology using the layer of resistive material is applied to the entire under surface of a printed circuit board, wherein only a small portion thereof is actually needed to form the terminating resistors, adds substantially to the cost of the circuit board while under utilizing the entire buried resistor structure.

SUMMARY OF THE INVENTION

According to the present invention, a printed circuit board structure is provided where there is a circuitized dielectric substrate having a plurality of signal traces thereon. The circuitized substrate has first and second opposite faces. An ASIC chip assembly is mounted on the first face and connected to the surface by solder connections. Preferably, the ASIC chip assembly is mounted on the substrate as an IC chip mounted on a chip carrier with the chip carrier being mounted to the circuit board by solder connections, preferably in the form of a ball grid array.

In one embodiment, a discrete signal termination device is provided which is disposed on the second face of the circuitized substrate directly opposite the ASIC chip assembly. In another embodiment, a discrete signal termination device is disposed between the ASIC chip assembly and the printed circuit board.

The signal termination device includes a plurality of planar resistors embedded in a dielectric material with the resistors being electrically connected to the signal lines on the circuitized substrate, preferably by solder connections, again in the form of a ball grid array.

In yet another embodiment, the signal termination device is formed as a part of the ASIC chip assembly by being incorporated in the chip carrier adjacent where the chip carrier is mounted to the circuitized substrate.

In all cases, the signal termination device need not be formed as a part of the circuit board but can be formed in discrete individual segments for attachment to either the circuit board or formed as part of the chip carrier, thus utilizing the entire structure of the termination device to form resistors.

DESCRIPTION OF THE PREFERRED EMBODIMENTS

Figure 1:
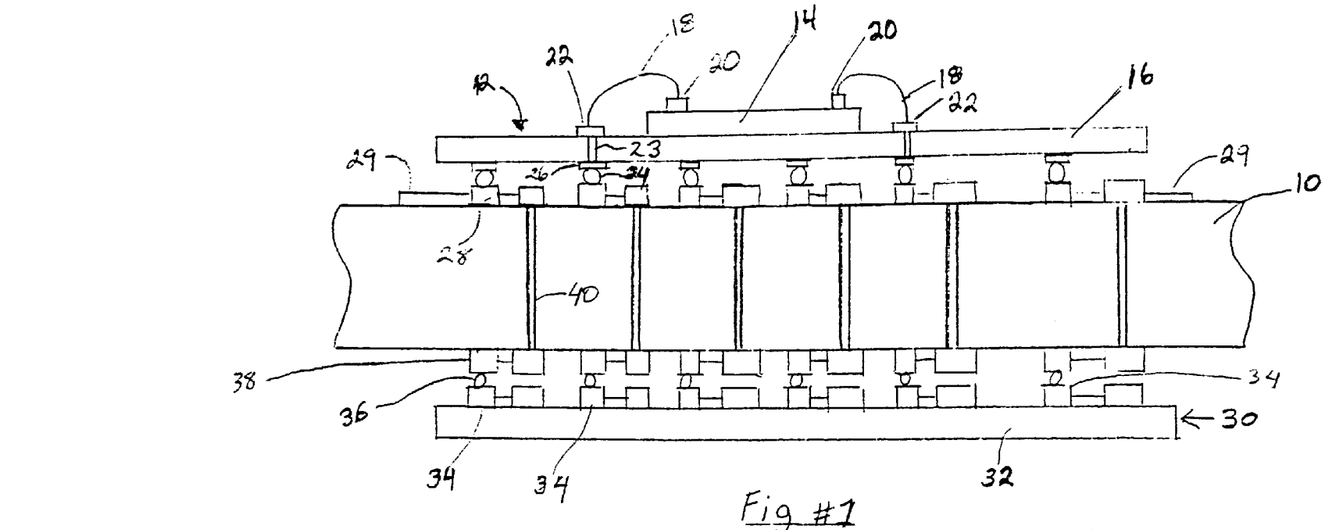
FIG. 1 is a side elevational view, partly in section, of one embodiment of a circuit board with an ASIC chip assembly mounted thereto on one face, and a signal termination device mounted on the opposite face of the circuit board according to this invention.
Figure 2:
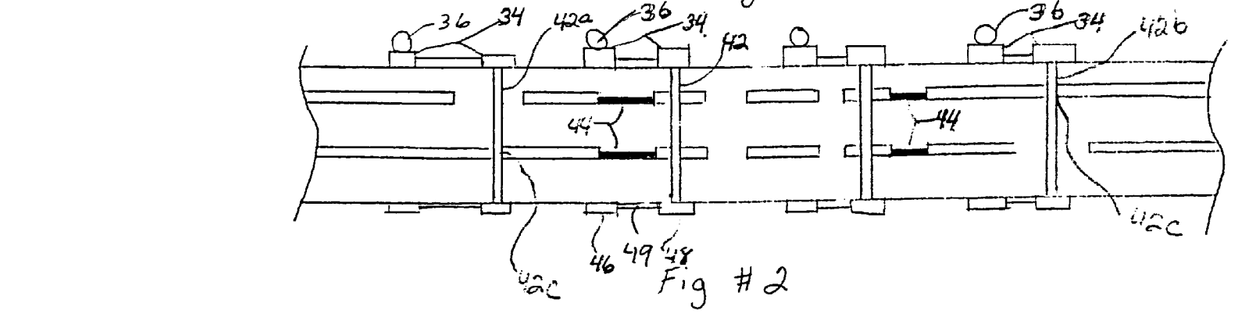
FIG. 2 is a detailed longitudinal sectional view, somewhat diagrammatic, of a portion of the signal termination device of FIG. 1.

Referring now to the drawings and, for the present to FIGS. 1 and 2, a signal termination device is shown mounted to a printed circuit board according to one embodiment of the present invention wherein the printed circuit board has an ASIC (application specific integrated circuit) chip assembly mounted thereon directly opposite the signal termination device . As used herein, the term ASIC chip or ASIC chip assembly can include either an IC chip or die mounted on a chip carrier, which chip carrier, in turn, is attached to the printed circuit board, or it can include a configuration where the integrated circuit chip or die is attached directly to the circuit board, sometimes referred to as direct chip attach (DCA) or chip on board (COB). The embodiments of the present invention shown in FIGS. 1, 2 and 4 of the mounting of a signal termination device can be employed with either type of configuration of the ASIC chip assembly, i.e. with the DCA, COB, or with the IC chip being attached to a chip carrier which, in turn, is attached to the printed circuit board. The embodiments described with respect to FIGS. 5, 6, 7 and 8 are applicable only where the chip or die is attached to a chip carrier which, in turn, is attached to a circuit board. However, all of the embodiments of the present invention are described utilizing an IC chip or die mounted on a chip carrier, which chip carrier, in turn, is mounted to the printed circuit board.

Still referring to FIGS. 1 and 2, a printed circuit board 10 is provided which is of generally conventional configuration and design. The printed circuit board 10 has an ASIC (application specific integrated circuit) chip assembly or structure 12 mounted thereon. The ASIC chip assembly 12 includes a die or integrated circuit (IC) chip 14 mounted on a chip carrier 16 which is of conventional design well known in the art, and which serves to mount the IC chip 14. The IC chip 14 is mounted to the chip carrier 16 by means of a conventional adhesive (such as a thin film of epoxy, not shown).

In the embodiment shown in FIGS. 1 and 2, the IC chip 14 is wire bonded to the chip carrier 16 by means of wire bonds 18 extending from pads 20 on the integrated circuit chip 14 to pads 22 on the chip carrier 16. This is a conventional technique for mounting integrated circuit chips to chip carriers. The pads 22 on one surface of the chip carrier 16 are connected by vias, one of which is shown at 23, to pads 26 on the opposite side of the chip carrier 26 in a conventional manner.

The ASIC chip assembly 12 is mounted to the circuit board 10 by means of solder balls 24 in a ball grid array connecting pads 26 on the chip carrier 16 and pads 28 on one side of the printed circuit board 10. This is a conventional mounting for an ASIC chip assembly 12 to a printed circuit board 10.

The circuit board 10 also has signal traces 29 on the same side thereof as the pads 28. (It should be noted that the circuit board 10 may have multiple internal signal layers and traces and/or signal traces on the opposite face of the circuit board 10 from where the pads 28 are located either in addition to or in place of traces 29. However, for simplicity of illustration, the circuit traces 29 are illustrated on the same surface or face of the circuit board as the pads 28.)

A signal termination device 30 is provided formed of planar resistor technology, which device is approximately the same size as the chip carrier 16. The function of device 30 is to provide parallel resistor terminations of appropriate value for the signal traces 29. The signal termination device 30 includes a dielectric substrate 32 which has pads 34 on one surface thereof. The pads 34 provide for connection of this termination device 30 to the circuit board 10 by solder balls 36 in a ball grid array to pads 38 on the surface of the printed circuit board 10 opposite that on which the ASIC chip assembly 12 is mounted.

The termination device includes vias 42 which connect pads 34 and 48 with parallel termination resistors 44. Pads 48 connect to pads 46 on the other surface of the substrate 32 by conductors 49 to allow In Circuit Testing (ICT) of the termination device 30. The termination voltage and logic ground connections between the printed circuit board 10 and termination device 30 are made by vias 42a and 42b. Vias 42a and 42b connect to the appropriate internal layers of the termination device at 42c. With the configuration shown, there are two layers of buried resistors 44 in the substrate 32.

The total thickness of this configuration is about 36.8 mils, and the thickness of each resistor 44 is between about 0.1 and 0.4 microns. Thus, with the structure shown, the signal termination device 30 provides the necessary resistor termination values for the signals carried by the circuit traces 29 (and other traces) in a flat, very compact, very thin structure for signal termination. The termination device 30 functions to terminate the signal traces 29 in the same way as layer(s) of the resistive core material laminated into the printed circuit board having resistors formed therein. In this case, the termination device 30 is an electrical parallel connection.

The technique for forming thin resistor termination sheets for use in printed circuit boards is well known in the art. As indicated earlier, in the prior art, a sheet of core laminate containing the buried resistors is provided to be laminated as a part of the circuit board 10, with the core laminate having the required resistor pattern formed therein for each ASIC chip assembly on the circuit board 10. This results in large regions of unused resistor material Such core laminates of material having the buried resistors and vias and pads formed thereon and therein are available from Omega Technologic Technologies, Inc.; thus, the method of forming such sheets of buried resistors need not be discussed in detail.

Figure 3:
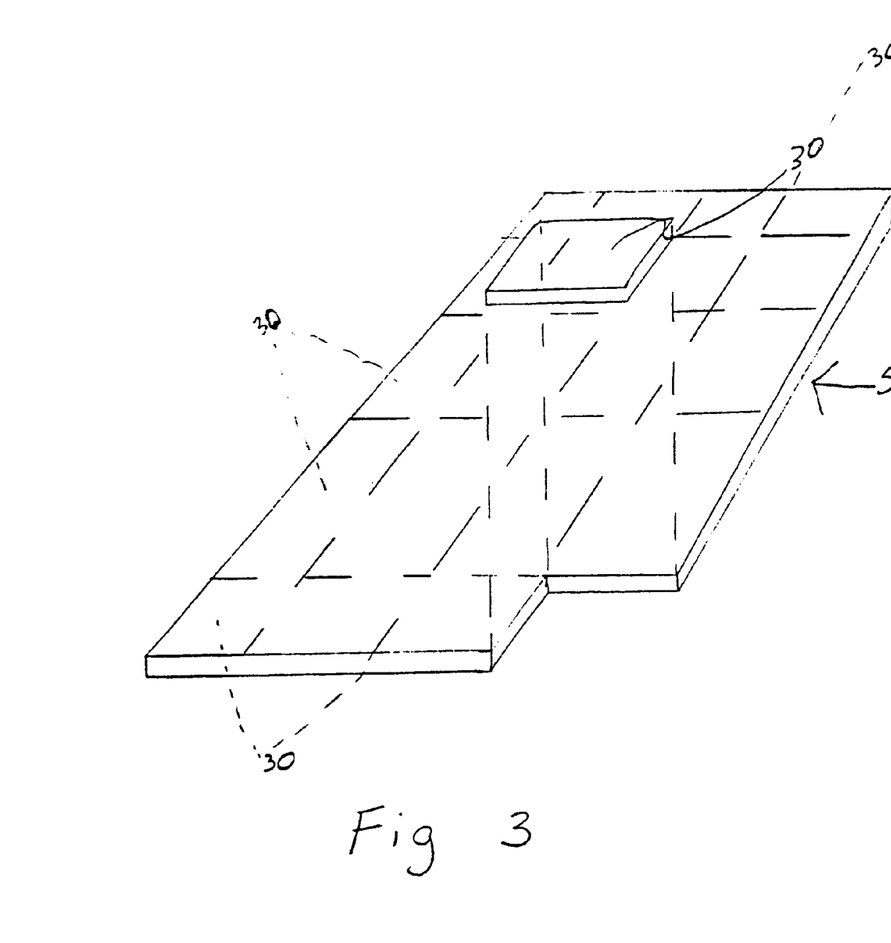
FIG. 3 is a perspective view, somewhat diagrammatic, of a sheet of buried resistor formed for separation into individual termination devices.

Referring now to FIG. 3, according to the present invention, a large panel 50 with multiple duplicate or unique images of the termination device is manufactured. The core laminate with layer(s) of embedded planar resistive material has buried resistors and via pads formed in a conventional manner, to provide the required resistor and via pattern needed for various ASIC chip assemblies 12. Two or more cores with resistor and via patterns are then laminated together with prepreg, vias drilled, plated, and then circuitized in a conventional manner to from the internal electrical connections. This completed panel is then sliced to provide individual termination devices 30 for each ASIC chip assembly as shown in FIG. 3. Thus, multiple duplicate or different patterns for an ASIC chip assembly can be formed in the entire panel of material 50 without regard to the configuration of ASIC assemblies on any given circuit board 10. This allows virtually the entire panel 50 to be formed into various ASIC chip assembly termination devices tailored to each ASIC chip assembly device without regard to the circuit board on which it is to be mounted.

Figure 4:
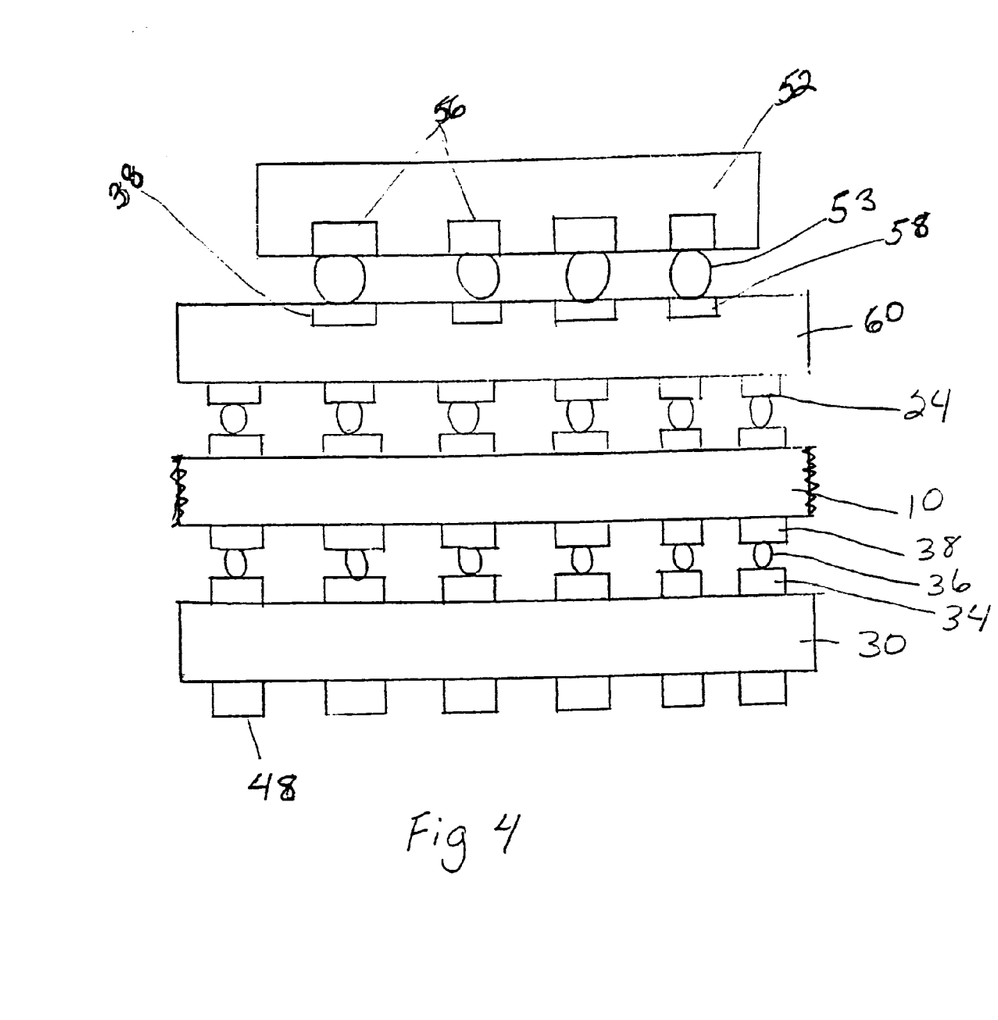
FIG. 4 is a longitudinal sectional view of a signal termination device mounted to a circuit board in a manner similar to FIG. 1, but wherein the ASIC chip assembly includes the IC chip mounted to the chip carrier using C4 connections.

Referring now to FIG. 4, another embodiment of the present invention is shown. In this embodiment, the structure of signal termination device 30 is similar to that of the signal termination device shown in FIGS. 1 and 2, as is the structure of the printed circuit board 10. The difference here is that integrated circuit chip 52 is provided which is mounted by C4 joints 53 (i.e. solder joints) between pads 56 on the chip 52 and pads 58 on chip carrier 60. This also is a conventional type of mounting of an integrated circuit chip onto a chip carrier and this FIG. 4 illustrates how the present invention is adapted for this type of mounting of the integrated circuit chip onto the chip carrier.

Figure 5:
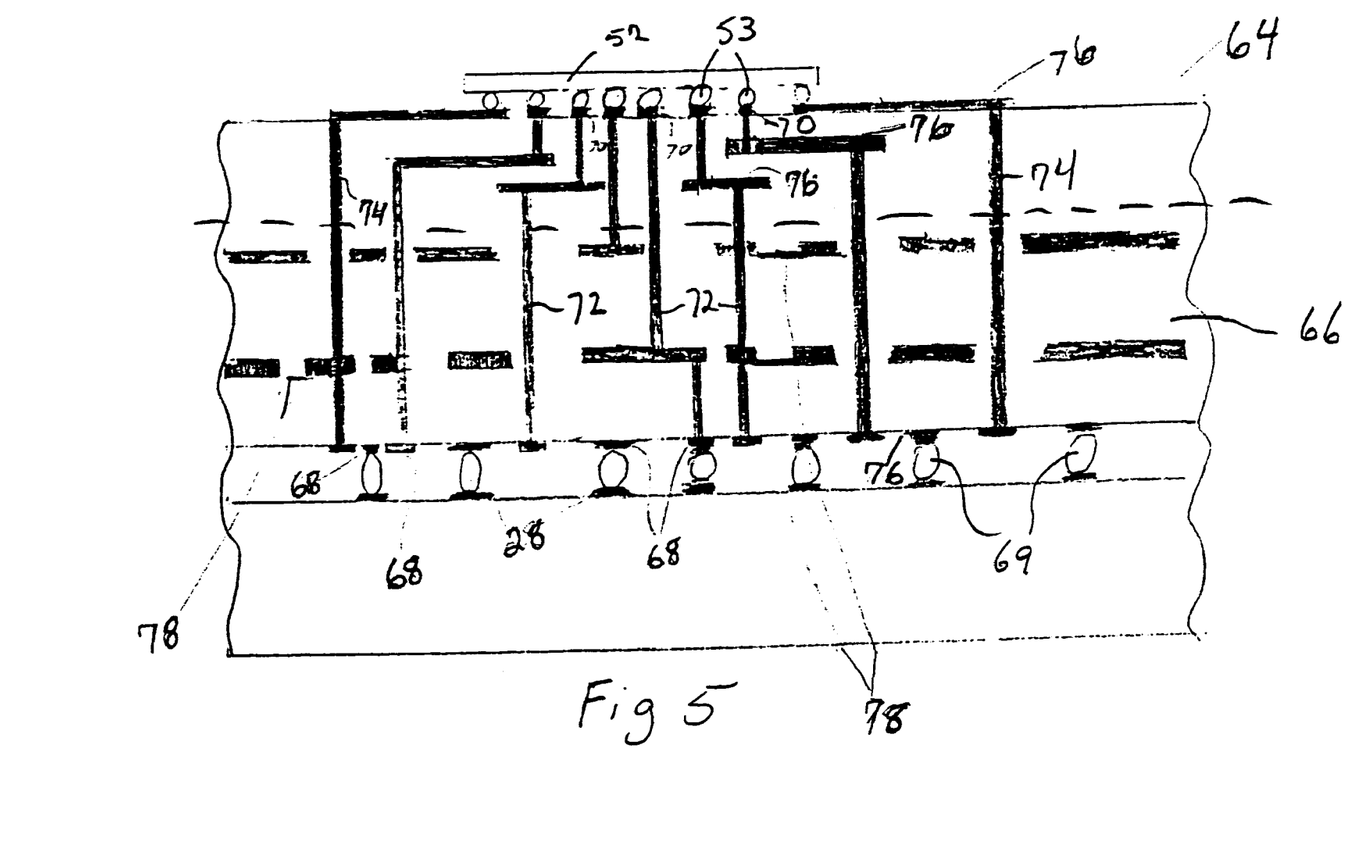
FIG. 5 is a side elevational view, partly in section, showing another embodiment of the signal termination device of the present invention incorporated in the chip carrier which, in turn, is mounted to the circuit board, wherein the IC chip is mounted to the chip carrier by C-4 connections.

Referring now to FIG. 5, another embodiment of the present invention is shown. In this embodiment, the signal termination device is laminated to the bottom side of the chip carrier and, thus, becomes an integral part thereof. As can be seen in FIG. 5, the chip carrier 64 is provided which has been laminated to the bottom side thereof, and is a part thereof, a signal terminating device 66. (Since the terminating device 66 is an integral part of the chip carrier 64, the line of demarcation of the terminating device 66 is shown in a broken line.) The signal terminating device 66 is similar to that shown in FIGS. 1 and 2, except that there are no test pads, and pads 68 on the surface of signal terminating device 66 are connected to the pads 28 on the PC board 10 by solder balls 69. The pads 68 are connected to pads 70 on the surface of the chip carrier 64 through blind or buried vias 72 and through vias 74. The chip carrier 64 includes signal planes 76. The vias 72 and 74 connect to internal parallel termination resistors 78 as well as the signal planes 76 formed on and in the chip carrier 64.

Thus, in this embodiment, the termination device is mounted directly to and essentially integral with the chip carrier and not to the printed circuit board and provides direct communication between the chip carrier and an integrated circuit chip through the signal termination device 66.

Figure 6:
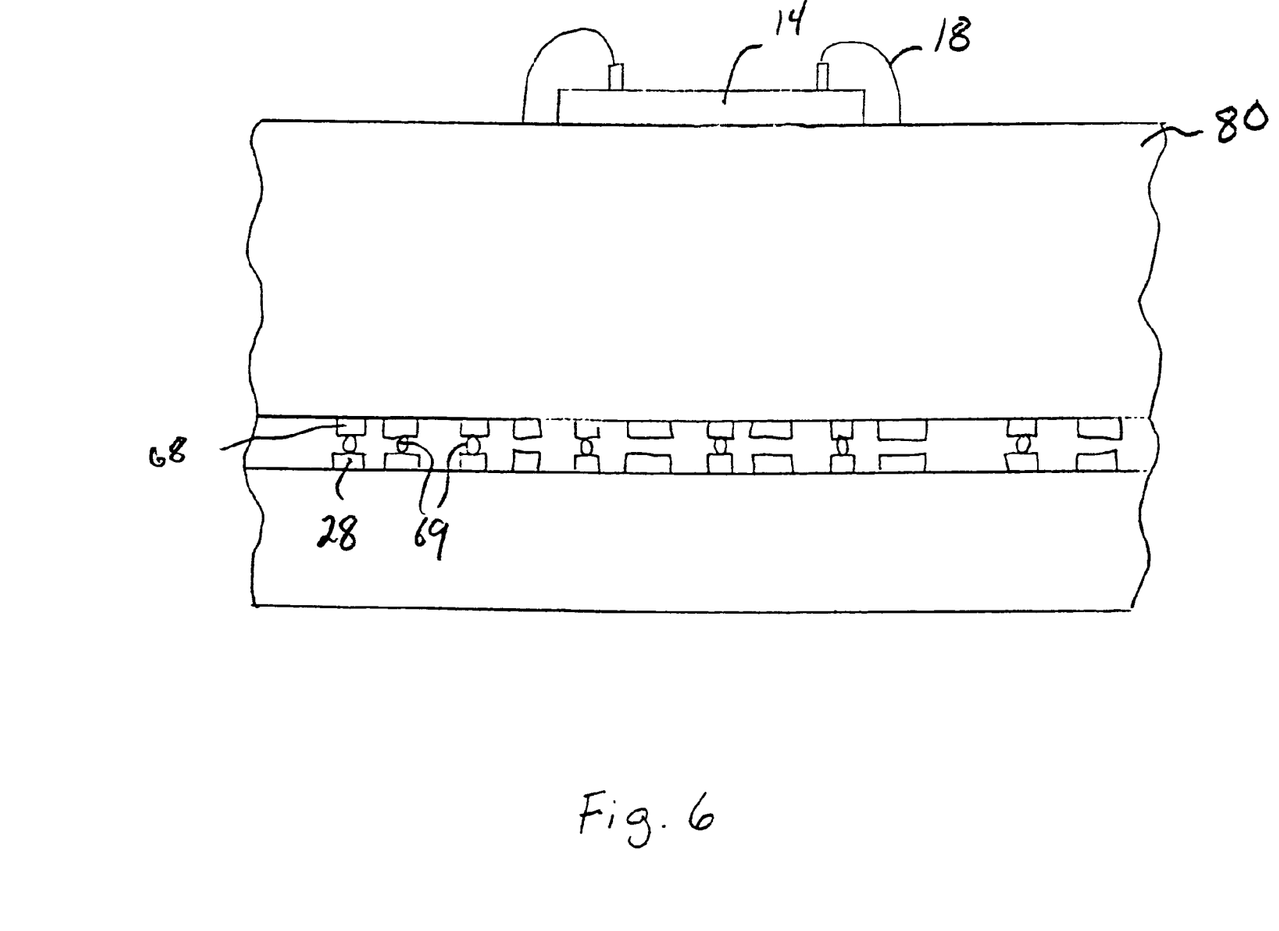
FIG. 6 is a view similar to FIG. 5 wherein the IC chip is mounted to the chip carrier using wire bond connections.

FIG. 6 is similar to FIG. 5 and shows how the signal termination device shown in FIG. 4 is used for a chip 14 mounted by wire bonds 18 to chip carrier 80 which has the termination device incorporated therein as in the embodiment of FIG. 5.

Figure 7:
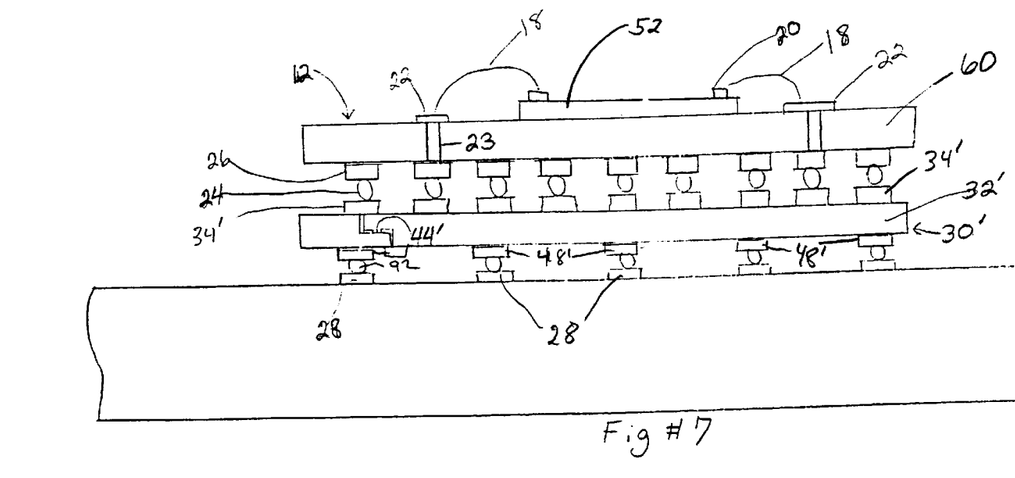
FIG. 7 is a side elevational view, partially in section, of another embodiment of the present invention where the termination device is interposed between the ASIC chip carrier and printed circuit board forming a series signal termination device.
Figure 8:
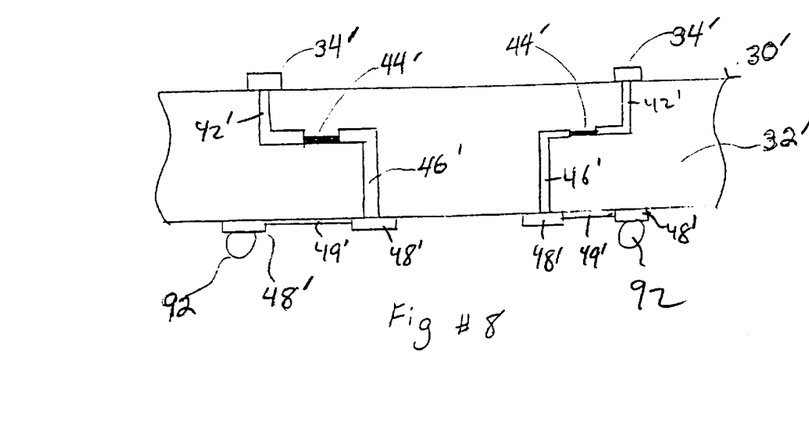
FIG. 8 is a detailed longitudinal sectional view, somewhat diagrammatic, of the series signal termination device of FIG. 7.

Referring now to FIGS. 7 and 8, another embodiment of this invention is shown. In this embodiment, the signal termination device is a separate device interposed between the ASIC chip assembly and the circuit board. In this embodiment, an ASIC chip assembly 12 identical to that of FIG. 1 is secured to a printed circuit board 10 identical to that of FIG. 1, through a signal termination device 30' which is similar to that of FIG. 1, except that resistors 44' in this device 30' are connected in series with pads 34' and pads 48' on opposite sides of substrate 32' through blind vias 42' and 46'. Solder balls 24 connect pads 26 on the chip carrier 16 to the pads 34' on the device 30' and solder balls 92 connect pads 48' on the device 30' to the pads 28 on the circuit board 10. FIG. 7 shows I/C chip 52 wire bonded to chip carrier 60. However, the I/C chip could be connected to the chip carrier by C4 joints rather than wire bonding. It should be noted that this series connection of the resistors 44' can also be used in the embodiments of FIGS. 5 and 6.

It will be appreciated that, utilizing the present invention, a signal termination device can be exactly tailored to each ASIC chip assembly 12 and applied either to the chip carrier part of the ASIC chip assembly or to the circuit board directly opposite the ASIC chip assembly and need not be applied as a laminate to the entire circuit board. Hence, during manufacture, the entire sheet can be manufactured into different termination devices, and different sizes, if desired, and when the manufacturing is completed, the sheet cut to provide the individual discrete signal termination devices tailored to specific ASIC chip assemblies in specific configurations mounted in a specific way to a printed circuit board. This provides a significant cost savings in that the entire surface area of the sheet that is formed into signal termination devices can be used to form the resistors specific to given ASIC chip assemblies and there need not be areas unused for signal termination, as in the case of applying the entire sheet to a printed circuit board.

Accordingly, the preferred embodiments of the present invention have been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A printed circuit board structure comprising a circuitized dielectric substrate having a plurality of signal traces thereon;

said circuitized substrate having first and second opposite faces;

a chip assembly mounted on said first face and connected to said circuit traces;

a signal termination device connected to said second face of said circuitized substrate opposite said chip;

said signal termination device including a plurality of planar resistors embedded in a dielectric material, said resistors being electrically connected to the signal traces on said circuitized substrate.

2. The invention as defined in claim 1 wherein said signal termination device is connected to said circuitized substrate by solder connections.

3. The invention as defined in claim 2 wherein said solder connections are in the form of a ball grid array.

4. The invention as defined in claim 1 wherein said chip assembly includes an I/C chip mounted on a chip carrier, and said chip carrier is mounted on said circuitized dielectric substrate.

5. The invention as defined in claim 4 wherein said I/C chip is mounted on said chip carrier by wire bond connections.

6. The invention as defined in claim 4 wherein said I/C chip is mounted to said chip carrier by solder connections.

7. The invention as defined in claim 1 wherein there are at least one or more levels of planar resistors, which are embedded in the termination device.

8. A printed circuit board structure comprising a circuitized dielectric substrate having a plurality of signal traces thereon;

a signal termination device connected to one face of said circuitized substrate;

a chip assembly including an I/C chip mounted on a chip carrier, and said chip carrier is mounted on said signal termination device;

said signal termination device including a plurality of planar resistors embedded in a dielectric material, said resistors being electrically connected to the signal traces on said circuitized substrate, and to said chip assembly.

9. The invention as defined in claim 8 wherein said signal termination device is connected to said circuitized substrate by solder connections.

10. The invention as defined in claim 9 wherein said solder connections are in the form of a ball grid array.

11. The invention as defined in claim 8 wherein said I/C chip is mounted on said chip carrier by wire bond connections.

12. The invention as defined in claim 8 wherein said I/C chip is mounted to said chip carrier by solder connections.

13. The invention as defined in claim 8 wherein there are at least one or more levels of planar resistors either in a series or parallel configuration are embedded in the termination device.

14. A printed circuit board structure comprising a circuitized dielectric substrate having a first face having plurality of signal traces thereon;

a chip assembly mounted on said first face and connected to said circuit traces; said chip assembly including an I/C chip and a chip carrier mounting said I/C chip, said chip carrier having formed as a part thereof a signal termination device and adjacent the dielectric substrate including a plurality of planar resistors embedded in a dielectric material, said resistors being electrically connected to the signal traces on said circuitized substrate.

15. The invention as defined in claim 14 wherein said chip assembly is connected to said circuitized substrate by solder connections.

16. The invention as defined in claim 15 wherein said solder connections are in the form of a ball grid array.

17. The invention as defined in claim 14 wherein said I/C chip is mounted on said chip carrier by wire bond connections.

18. The invention as defined in claim 14 wherein said I/C chip is mounted to said chip carrier by solder connections.

19. The invention as defined in claim 14 wherein there are one or more levels of planar resistors, which are embedded in the chip assembly.

* * * * *

UNITED STATES PATENT AND TRADEMARK OFFICE
CERTIFICATE OF CORRECTION

PATENT NO. : 6,351,391 B1
DATED : February 26, 2002
INVENTOR(S) : C. Beliveau et al.

It is certified that error appears in the above-identified patent and that said Letters Patent is hereby corrected as shown below:

<u>Title page,</u>
"*Attorney, Agent of Firm*" delete "Hoog" and insert -- Hogg --.

Signed and Sealed this

Ninth Day of July, 2002

Attest:

Attesting Officer

JAMES E. ROGAN
*Director of the United States Patent and Trademark Office*